US009392695B2

(12) United States Patent
Cho

(10) Patent No.: US 9,392,695 B2
(45) Date of Patent: Jul. 12, 2016

(54) ELECTRIC COMPONENT MODULE

(71) Applicant: SAMSUNG ELECTRO-MECHANICS CO., LTD., Suwon (KR)

(72) Inventor: Min Gi Cho, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 87 days.

(21) Appl. No.: 14/321,068

(22) Filed: Jul. 1, 2014

(65) Prior Publication Data
US 2015/0195913 A1 Jul. 9, 2015

(30) Foreign Application Priority Data

Jan. 3, 2014 (KR) .................... 10-2014-0000907
Feb. 10, 2014 (KR) .................... 10-2014-0014737

(51) Int. Cl.
*H05K 1/16* (2006.01)
*H05K 7/00* (2006.01)
(Continued)

(52) U.S. Cl.
CPC ............. *H05K 1/181* (2013.01); *H01L 21/563* (2013.01); *H01L 23/13* (2013.01); *H01L 23/49822* (2013.01); *H01L 23/49833* (2013.01); *H05K 1/144* (2013.01); *H05K 3/28* (2013.01); *H01L 23/3128* (2013.01); *H01L 23/50* (2013.01); *H01L 2224/16225* (2013.01); *H01L 2924/1531* (2013.01); *H01L 2924/19105* (2013.01); *H01L 2924/19106* (2013.01); *H05K 1/0251* (2013.01); *H05K 1/113* (2013.01);
(Continued)

(58) Field of Classification Search
CPC .................. H05K 1/181; H05K 3/28; H05K 2201/09436; H05K 2201/09909; H05K 2201/10378
USPC .................................. 174/260; 361/760, 761
See application file for complete search history.

(56) References Cited

U.S. PATENT DOCUMENTS 6,285,559 B1 * 9/2001 Fukiharu .............. H05K 1/0243
257/E23.114
7,023,706 B2 * 4/2006 Negishi .................. H01L 23/36
257/E23.101
(Continued)

FOREIGN PATENT DOCUMENTS

| JP | 11-102991 | 4/1999 |
| JP | 2009-16378 | 1/2009 |
| JP | 2012-204557 | 10/2012 |
| KR | 10-0782774 | 11/2007 |
| KR | 10-1274460 | 6/2013 |

OTHER PUBLICATIONS

Korean Office Action issued Oct. 15, 2014 in corresponding Korean Patent Application No. 10-2014-0014737.

*Primary Examiner* — Sherman Ng
(74) *Attorney, Agent, or Firm* — NSIP Law

(57) ABSTRACT

There is provided an electronic component module capable of increasing the degree of integration by mounting electronic components on both surfaces of a substrate. The electronic component module according to an exemplary embodiment of the present disclosure includes a first substrate having one surface on which at least one electronic component is mounted; and a second substrate bonded to one surface of the first substrate and including at least one component accommodating part in which the at least one electronic component is accommodated, wherein the second substrate includes a core layer, and metal wiring layers formed on both surfaces of the core layer and having a plurality of electrode pads.

14 Claims, 8 Drawing Sheets

(51) Int. Cl.
*H05K 1/18* (2006.01)
*H05K 1/14* (2006.01)
*H05K 3/28* (2006.01)
*H01L 23/498* (2006.01)
*H01L 21/56* (2006.01)
*H01L 23/13* (2006.01)
*H05K 1/02* (2006.01)
*H05K 1/11* (2006.01)
*H01L 23/31* (2006.01)
*H01L 23/50* (2006.01)

(52) U.S. Cl.
CPC . *H05K 2201/099* (2013.01); *H05K 2201/0989* (2013.01); *H05K 2201/09436* (2013.01); *H05K 2201/09909* (2013.01); *H05K 2201/10378* (2013.01); *H05K 2201/2018* (2013.01); *H05K 2203/1327* (2013.01)

(56) References Cited

U.S. PATENT DOCUMENTS

| | | | |
|---|---|---|---|
| 7,569,925 B2* | 8/2009 | Nishizawa | H01L 23/13 257/700 |
| 2004/0022038 A1* | 2/2004 | Figueroa | H01L 23/642 361/763 |
| 2007/0056766 A1* | 3/2007 | Sunohara | H01L 23/5385 174/260 |
| 2007/0273014 A1 | 11/2007 | Lee et al. | |
| 2011/0234047 A1* | 9/2011 | Muraki | G01K 7/16 310/315 |
| 2012/0319792 A1* | 12/2012 | Harima | H03H 9/1021 331/158 |
| 2013/0127025 A1 | 5/2013 | Cho | |
| 2014/0054080 A1* | 2/2014 | Sato | H05K 1/183 174/266 |

\* cited by examiner

ELECTRIC COMPONENT MODULE

CROSS-REFERENCE TO RELATED APPLICATIONS

This application claims the benefit of Korean Patent Application No. 10-2014-0000907 filed on Jan. 3, 2014, and 10-2014-0014737 filed on Feb. 10, 2014, with the Korean Intellectual Property Office, the disclosures of which are incorporated herein by reference.

BACKGROUND

The present disclosure relates to an electronic component module, and more particularly, to an electronic component module having an increased degree of integration through electronic components being mounted on both surfaces of a substrate.

Recently, in the electronic products market, demand for portable devices has rapidly increased. Therefore, the miniaturization and lightening of electronic components mounted on electronic products has been continuously demanded.

In order to realize the miniaturization and lightening of electronic components, a system on chip (SOC) technology of providing a plurality of individual components on a single chip, a system-in-package (SIP) technology of integrating a plurality of individual components in a single package, or the like, as well as a technology of reducing the sizes of individually mounted components are required.

Meanwhile, in order to manufacture an electronic component module having a small size and high performance, a structure in which electronic components are mounted on both surfaces of a substrate has also been developed.

However, in the case in which electronic components are mounted on both surfaces of a substrate, it may be difficult to form an external connection terminal on the substrate.

That is, since the electronic components are mounted on both surfaces of the substrate, a position in which the external connecting terminal is formed is not clearly specified. Therefore, a double-sided mounting-type electronic component module allowing an external connecting terminal to be easily formed has been demanded.

RELATED ART DOCUMENT (Patent Document 1) Korean Patent No. 10-0782774

SUMMARY

An aspect of the present disclosure may provide a double-sided mounting-type electronic component module allowing electronic components to be mounted on both surfaces of a substrate.

According to an aspect of the present disclosure, an electronic component module may include: a first substrate having one surface on which at least one electronic component is mounted; and a second substrate bonded to one surface of the first substrate and including at least one component accommodating part in which the at least one electronic component is accommodated, wherein the second substrate may include a core layer, and metal wiring layers formed on both surfaces of the core layer and having a plurality of electrode pads.

The electronic component module may further include a bonding layer interposed between the first substrate and the second substrate.

One surface of the first substrate may be provided with a blocking part corresponding to a shape of the component accommodating part of the second substrate to block a movement of the bonding layer.

The blocking part may be formed as a groove or as a protrusion.

The blocking part may be spaced apart from the component accommodating part by a predetermined distance in a horizontal direction.

The blocking part may be spaced apart from corner portions of the component accommodating part by a distance greater than that from straight portions of the component accommodating part.

The blocking part may be curved or rounded in the corner portions of the component accommodating part.

One surface of the first substrate may be provided with an insulating protective layer, and the blocking part may be formed on the insulating protective layer.

The insulating protective layer may be only formed inside the blocking part.

The insulating protective layer may be only formed outside the blocking part.

The second substrate may include an insulating protective layer which is disposed on any one of the metal wiring layers.

The second substrate may be provided with at least one electrode pad exposed through a through-hole formed in the insulating protective layer.

The electrode pad may be disposed to be spaced apart from the insulating protective layer in the through-hole formed in the insulating protective layer.

The electrode pad may fill the through-hole formed in the insulating protective layer.

The bonding layer may be bonded to the core layer of the second substrate.

The electronic component module may further include a mold part sealing at least one electronic component mounted on the other surface of the first substrate.

According to another aspect of the present disclosure, an electronic component module may include: a first substrate on which at least one electronic component is mounted; a second substrate bonded to the first substrate and including at least one component accommodating part, in which the at least one electronic component is accommodated; and a bonding layer interposed between the first substrate and the second substrate, wherein the first substrate may be provided with a blocking part corresponding to a shape of the component accommodating part of the second substrate to block a movement of the bonding layer, and a distance between the blocking part and the component accommodating part may be greater in corner portions of the blocking part than straight portions of the blocking part.

According to another aspect of the present disclosure, an electronic component module may include: a first substrate on which at least one electronic component is mounted; a second substrate bonded to the first substrate and including at least one component accommodating part, in which the at least one electronic component is accommodated; and a bonding layer interposed between the first substrate and the second substrate, wherein the second substrate may include a core layer and an insulating protective layer disposed on one surface of the core layer, and the bonding layer may be bonded to the other surface of the core layer of the second substrate.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
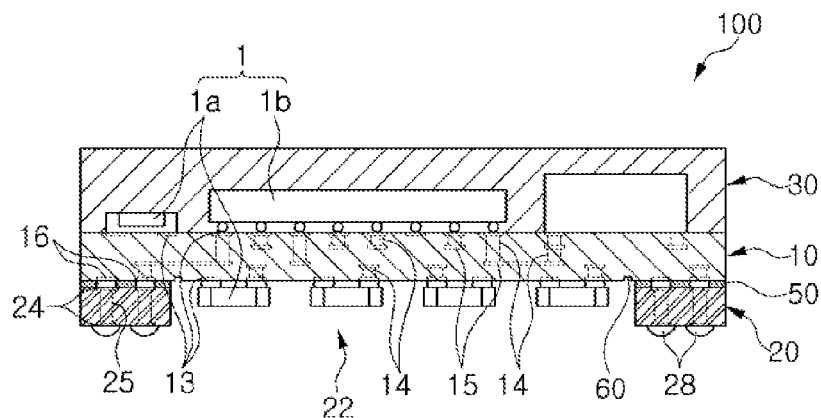
FIG. 1 is a cross-sectional view schematically illustrating an electronic component module according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 2:
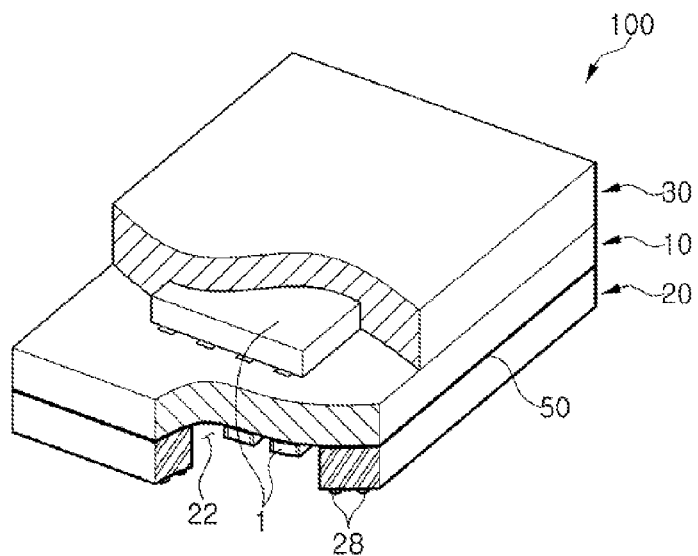
FIG. 2 is a partially cut-away perspective view illustrating an inner portion of the electronic component module of FIG. 1.
Figure 3:
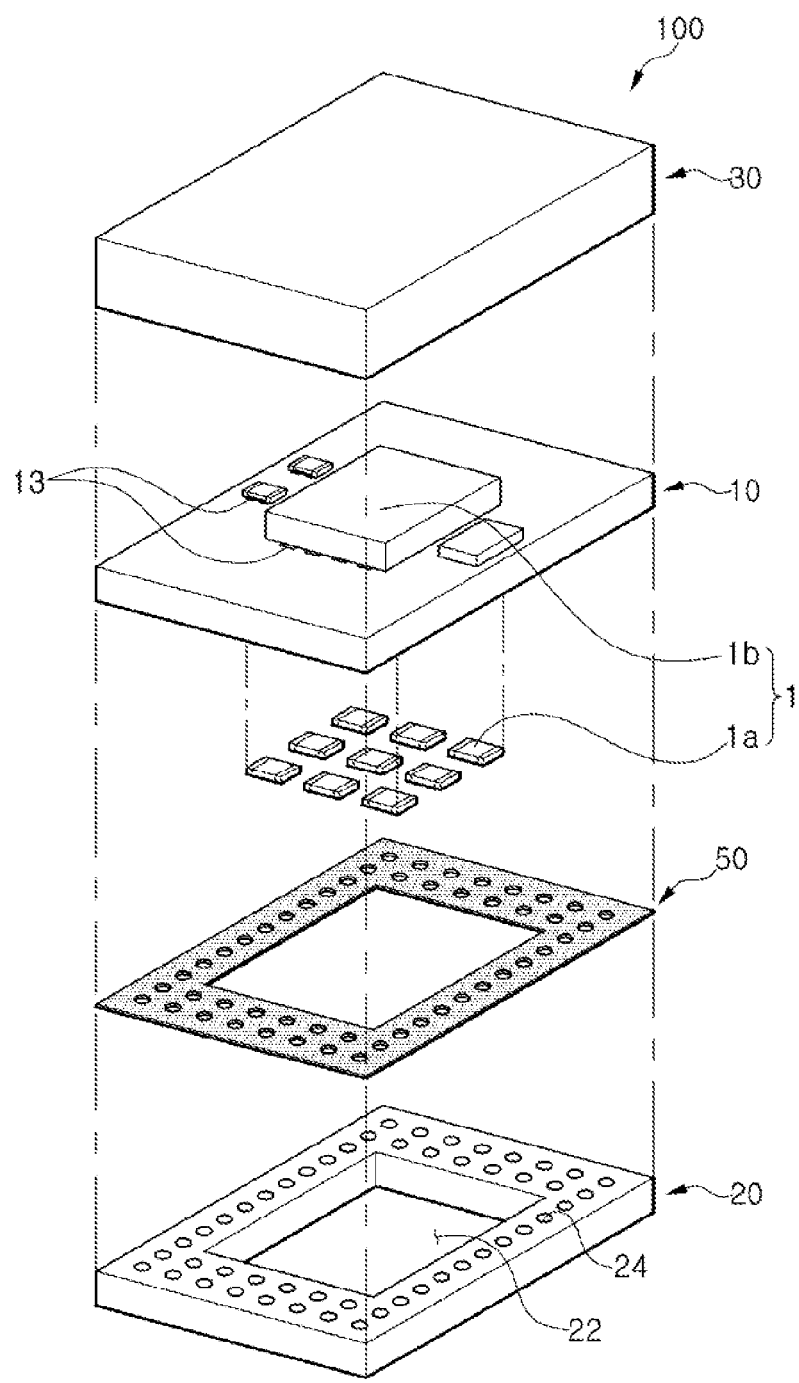
FIG. 3 is an exploded perspective view of the electronic component module of FIG. 1.

FIG. 1 is a cross-sectional view schematically illustrating an electronic component module according to an exemplary embodiment of the present disclosure, FIG. 2 is a partially cut-away perspective view illustrating an inner portion of the electronic component module of FIG. 1, and FIG. 3 is an exploded perspective view of the electronic component module of FIG. 1. In addition, FIG. 4, a cross-sectional view schematically illustrating a coupling structure of a first substrate and a second substrate according to an exemplary embodiment of the present disclosure, shows a cross-section taken along line V-V of FIG. 8.

Referring to FIGS. 1 through 4, an electronic component module 100 according to the present exemplary embodiment may be configured to include one or more electronic components 1, a first substrate 10, a second substrate 20, and a mold part 30.

The electronic components 1 may include various components such as a passive component 1a and an active component 1b and any component which may be mounted on the substrate may be used as the electronic component 1.

The electronic components 1 may be mounted on both top and bottom surfaces of the first substrate 10 to be described below. FIG. 1 shows a case in which both the active component 1b and the passive component 1a are mounted on the top surface of the first substrate 10 and only the passive component 1a is mounted on the bottom surface of the first substrate 10, as an example. However, the present disclosure is not limited thereto, but the electronic components 1 maybe disposed on both surfaces of the first substrate 10 in various arrangements depending on sizes or shapes of the electronic components 1 and a design of the electronic component module 100.

The mold part 30 may be formed on at least one surface of the first substrate 10. According to the present exemplary embodiment, the mold part 30 is formed on the top surface of the first substrate 10 to thereby seal the electronic components 1.

The mold part 30 fills spaces between the electronic components 1 mounted on the first substrate 10, thereby preventing the occurrence of an electrical short circuit between the electronic components 1. In addition, the mold part 30 may enclose the exterior of the electronic components 1 and fix the electronic components 1 to the substrate, thereby securely protecting the electronic components 1 from external impact.

The mold part 30 may be formed of an insulating material containing a resin material such as an epoxy resin, or the like . In addition, the mold part 30 according to the present exemplary embodiment may be formed by seating the first substrate 10 having the electronic components 1 mounted on the top surface thereof in a mold (not shown) and injecting a resin into the mold. However, the present disclosure is not limited thereto.

The substrate may include the first substrate 10 and the second substrate 20. The substrate may be formed by repeatedly stacking a metal wiring layer 15 and an insulating material layer 10b on both surfaces thereof based on a core layer 10a or 20a. Here, the metal wiring layer 15 may include a circuit pattern 15 or bonding pads 13 and 16.

The first substrate 10 has one or more electronic components 1, mounted on both surfaces thereof. As the first substrate 10, various kinds of substrates (for example, a ceramic substrate, a printed circuit board, a flexible board, and the like) well known in the art may be used. In addition, a plurality of bonding pads may be formed on both surfaces of the first substrate 10. Here, the bonding pads may include mounting electrodes 13 for mounting the electronic component or external connection pads 16 for making electrical connection to the second substrate 20.

In addition, although not shown, the first substrate 10 may be provided with wiring patterns electrically connecting the bonding pads 13 and 16 to each other.

The first substrate 10 according to the present exemplary embodiment may be a multilayer substrate including a plurality of layers, and may be a substrate having four metal wiring layers, for example.

In addition, the first substrate 10 according to the present exemplary embodiment may include conductive vias 14 electrically connecting the mounting electrodes 13 formed on the top surface of the first substrate 10 and the external connection pads 16 to the circuit patterns 15 formed inside the first substrate 10.

In addition, the first substrate 10 according to the present exemplary embodiment may have cavities (not shown) allowing the electronic components 1 to be embedded in the first substrate 10.

In addition, the first substrate 10 according to the present exemplary embodiment may have the external connection pads 16 formed on the bottom surface thereof. The external connection pad 16 may be provided to be electrically connected to the second substrate 20 and may be connected to an external connection terminal 28 through the second substrate 20.

Therefore, the external connection pad 16 may be disposed on the bottom surface of the first substrate 10 in a position facing the top surface of the second substrate 20 when the second substrate 20 is coupled to the first substrate 10. If necessary, the plurality of external connection pads 16 may be disposed in various forms.

Figure 4:
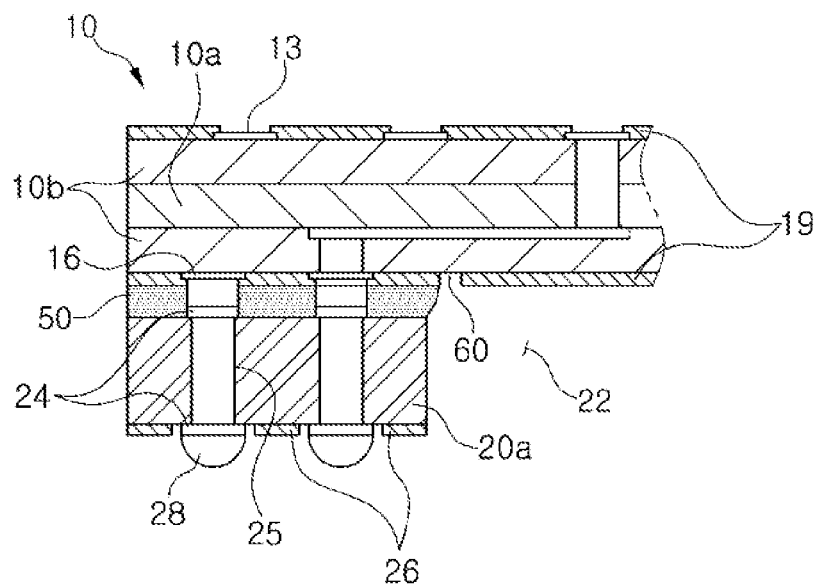
FIG. 4 is a cross-sectional view schematically illustrating a coupling structure of a first substrate and a second substrate according to an exemplary embodiment of the present disclosure.

In addition, as shown in FIG. 4, insulating protective layers 19 may be formed on both surfaces of the first substrate 10. Here, the insulating protective layer 19 may be formed of a solder resist.

Therefore, the bonding pads 13 and 16 of the first substrate 10 may be formed to penetrate through the insulating protective layers 19. Particularly, sides of the bonding pads 13 and 16 may contact the insulating protective layers 19.

The second substrate 20 may be disposed below the first substrate 10 to be coupled to the first substrate 10.

In addition, the second substrate 20 according to the present exemplary embodiment may have a component accommodating part 22 which is formed as a hollow place inside the second substrate 20. The component accommodating part 22 may be used as a space in which the electronic components 1 mounted on the bottom surface of the first substrate 10 are accommodated. Therefore, the electronic components 1 may only be mounted on the bottom surface of the first substrate 10 in a position facing the component accommodating part 22 of the second substrate 20.

Similar to the first substrate 10, various kinds of substrates (for example, a ceramic substrate, a printed circuit board, a flexible board, and the like) well known in the art may be used as the second substrate 20.

In addition, electrode pads 24 may be formed on both surfaces of the second substrate 20. The electrode pad 24 formed on the top surface of the second substrate 20 may be provided to be electrically connected to the external connection pad 16 of the first substrate 10. In addition, the electrode pad 24 formed on the bottom surface of the second substrate 20 may be provided to be fastened to the external connection terminal 28. Meanwhile, although not shown, both surfaces of the second substrate 20 may be provided with wiring patterns electrically connecting the electrode pads 24 to each other.

The second substrate 20 may include conductive vias 25 electrically connecting the electrode pads formed on both surfaces thereof to the circuit patterns formed inside the second substrate 20.

In addition, a thickness of the second substrate 20 according to the present exemplary embodiment may be greater than a height of the electronic components 1 mounted on the bottom surface of the first substrate 10 in order to stably protect the electronic components 1 accommodated in the component accommodating part 22. However, the present disclosure is not limited thereto.

The second substrate 20 according to the exemplary embodiment may be a multilayer substrate including a plurality of layers, and circuit patterns (not shown) for making electrical connection may be formed between the respective layers.

For example, as shown in FIG. 4, the second substrate 20 according to the present exemplary embodiment may be a two-layer substrate having two metal wiring layers, and may have the electrode pads 24, which are metal wiring layers, formed on both surfaces of the core layer 20a. That is, the electrode pads 24 may be a part of the metal wiring.

In the case in which the second substrate 20 has a two-layer structure as in the present exemplary embodiment, manufacturing cost may be reduced as compared to a case in which the second substrate 20 is formed of two or more layers (for example, a four-layer substrate). In addition, since the number of conductive vias 25 formed in the second substrate 20 may be significantly reduced, a signal transfer path may be reduced, such that generation of parasitic components L and C, which are unnecessary in view of high frequency signal characteristics may be significantly reduced. Therefore, degradation of high frequency matching characteristics may be reduced.

In addition, insulating protective layers 26 may only be formed on one surface of the core layer 20a, that is, the bottom surface of the second substrate 20. That is, the top surface of the second substrate 20 is only provided with the electrode pads 24 formed on the core layer and is not provided with the insulating protective layer. Such a configuration is intended to secure a maximum distance between the first and second substrates 10 and 20. Therefore, the configuration of the present disclosure is not limited thereto. The insulating protective layer 19 on the bottom surface of the first substrate 10 may be omitted, if necessary.

Due to the omission of the insulating protective layer on the top surface of the second substrate 20, the distance between the bottom surface of the first substrate 10 and the top surface of the second substrate 20 may be further increased by a thickness of the insulating protective layer.

As a result, during a process of manufacturing the electronic component module 100, flux between the first substrate 10 and the second substrate 20 may be easily removed. In addition, during a process of forming a bonding layer 50, a liquid insulating material for forming the bonding layer 50 may be easily injected between the first substrate 10 and the second substrate 20. In addition, non-filling of the insulating material for forming the bonding layer 50 between the first and second substrates 10 and 20, or generation of voids in the bonding layer 50 may be significantly reduced.

The insulating protective layer 26 may be formed on the bottom surface of the second substrate 20. In this case, the insulating protective layer 26 may be formed to cover portions of the metal wiring layer. In addition, the electrode pads 24 may be disposed to penetrate through the insulating protective layer 26 to be exposed outwardly, without being covered by the insulating protective layer 26.

As a result, the external connection terminal 28 may be fastened to the electrode pad 24 on the bottom surface of the second substrate 20.

Here, the second substrate 20 according to the present exemplary embodiment may have the electrode pads 24 and the insulating protective layer 26 spaced apart from each other by a predetermined distance. That is, the electrode pads 24 may be disposed in through-holes formed in the insulating protective layer 26 and may be disposed to be spaced apart from the insulating protective layer 26 by a predetermined distance. Therefore, a space may be formed between the insulating protective layer 26 and the electrode pad 24. However, the present disclosure is not limited thereto.

In addition, the external connection terminal 28 according to the present exemplary embodiment may be formed as a solder ball or a solder bump, and may be formed through a solder printing method.

Here, in the case in which the solder printing method is used in a state in which the insulating protective layer is not formed on the bottom surface of the second substrate, deviations in amounts of printed solder printing amount may be increased, resulting in increased deviations in heights of the external connection terminals, whereby mounting defects may occur during a process of mounting the electronic component module on a main board (not shown).

However, according to the present exemplary embodiment, the insulating protective layer 26 is formed on the bottom surface of the second substrate 20 on which a solder is to be printed, and thus, a metal mask may be firmly adhered to the second substrate 20, thereby allowing the amount of printed solder to be uniform.

The external connection terminal 28 may be formed on the bottom surface of the second substrate 20. The external connection terminal 28 may electrically and physically connect the electronic component module 100 to a main substrate (not shown) on which the electronic component module 100 is to be mounted.

The external connection terminal 28 described above may be disposed on the electrode pad 24 formed on the bottom surface of the second substrate 20. The external connection terminal 28 may be formed in a bump form, but is not limited thereto. For example, the external connection terminal 28 may be formed in various forms such as a solder ball, and the like.

The external connection terminal 28 may be electrically connected to the electrode pad 24 formed on the top surface of the second substrate 20 through the via 25. Therefore, in the case in which the second substrate 20 is coupled to the first substrate 10, the first substrate 10 may be electrically connected to the external connection terminal 28 through the second substrate 20.

The first and second substrates 10 and 20 according to the present exemplary embodiment may have the core layers 10a and 20a formed of a material having low thermal expansion in order to significantly reduce thermal deformation or warpage. In addition, the core layers 10a and 20a of the first substrate 10 and the second substrate 20 maybe formed of the same material.

Meanwhile, the second substrate 20 according to the embodiment of the present disclosure is not limited to the above-mentioned configuration of FIG. 4.

Figure 5:
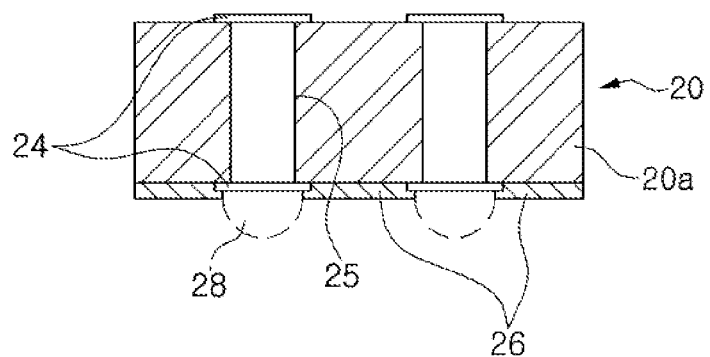
FIGS. 5 through 7 are cross-sectional views schematically illustrating a second substrate according to another exemplary embodiment of the present disclosure.
Figure 6:
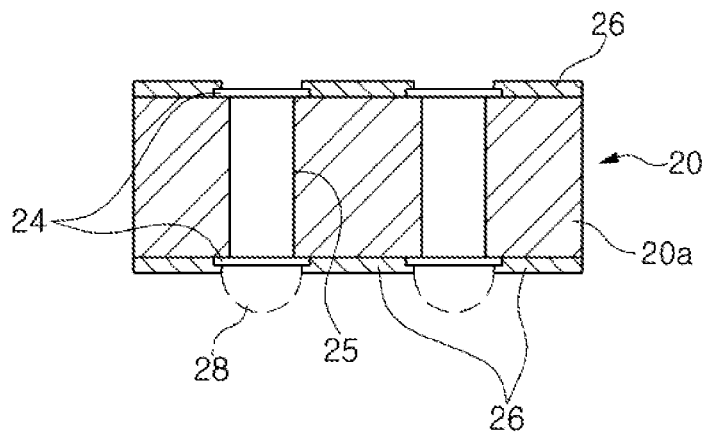
Figure 7:
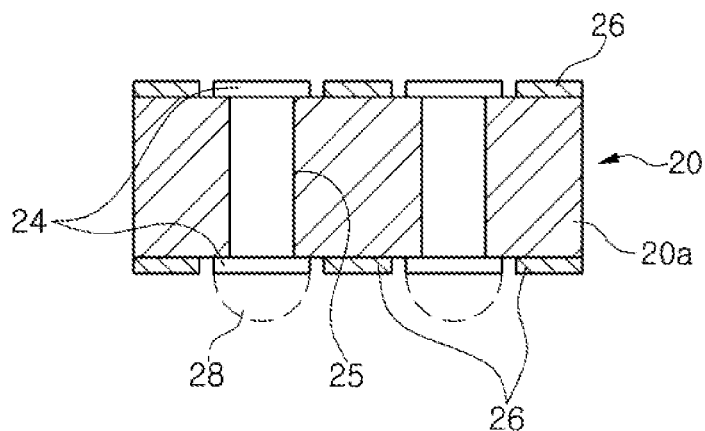

FIGS. 5 through 7 are cross-sectional views schematically illustrating a second substrate according to another exemplary embodiment of the present disclosure.

As shown in FIG. 5, the second substrate 20 according to another exemplary embodiment of the present disclosure may be formed to have the electrode pads 24 in contact with the insulating protective layer 26. That is, there is no space between the electrode pads 24 and the insulating protective layer 26, and the electrode pads 24 may be formed to fill all through-holes formed in the insulating protective layer 26.

Here, edge portions of the electrode pads 24 may be covered by the insulating protective layer 26. That is, the edge portions of the electrode pads 24 may be buried in the insulating protective layer 26. In this case, delamination of the electrode pads 24 from the second substrate 20 may be prevented.

However, the present inventive concept is not limited thereto, but various configurations may be applied, if necessary. For example, exposed surfaces of the electrode pads 24 and an outer surface of the insulating protective layer 26 may be disposed on approximately the same plane.

In addition, as shown in FIGS. 6 and 7, according to exemplary embodiments of the present disclosure, the insulating protective layer 26 may be formed on both surfaces of the second substrate 20. In this case, the electrode pads 24 and the insulating protective layers 26 may be formed to be spaced apart from each other, as shown in FIG. 6, or may be formed to contact each other, as shown in FIG. 7.

In addition, variations may be made, if necessary. For example, the electrode pads 24 on the top surface of the second substrate 20 may have different forms from those of the electrode pads 24 on the bottom surface thereof.

Meanwhile, such configurations of the insulating protective layer 26 and the electrode pads 24 of the second substrate 20 may be equally applied to the insulating protective layer 19 and the bonding pads 13 and 16 of the first substrate 10.

In addition, the electronic component module 100 according to the present exemplary embodiment may have a blocking part 60 formed on the bottom surface of the first substrate 10.

The blocking part 60 may be used in case of forming an insulating part 50 to be described below. In particular, the blocking part 60 may be provided to allow the insulating part 50 to be only formed in a gap between the first substrate 10 and the second substrate 20.

The blocking part 60 may be provided to block a liquid insulating material injected between the first substrate 10 and the second substrate 20 from being poured into an inner space of the component accommodating part 22 of the second substrate 20, during a process of forming the insulating part 50 between the first substrate 10 and the second substrate 20.

Therefore, the blocking part 60 according to the present exemplary embodiment may be formed in a continuous ring shape to correspond to a shape of the component accommodating part 22 formed in the second substrate 20. More specifically, the blocking part 60 may be formed as a ring-shaped groove having a predetermined depth in the bottom surface of the first substrate 10.

As such, in the case in which the blocking part 60 is formed as the groove, the injected liquid insulating material may not be easily introduced into the groove due to surface tension generated around edge portions of the blocking part 60.

However, the configuration of the blocking part 60 is not limited thereto. The blocking part 60 may be variously modified. For example, the blocking part may be protruded by a predetermined height.

The above-mentioned blocking part 60 may be formed in advance during a process of manufacturing the first substrate 10. However, the present disclosure is not limited thereto, and the blocking part may be formed by mounting structures (in case of the protruded form) together with the electronic components 1 during a process of mounting the electronic components 1.

Meanwhile, the blocking part 60 in the present exemplary embodiment is formed to correspond to the shape of the component accommodating part 22 formed in the second substrate 20, but is not limited thereto.

Since the blocking part 60 is provided to block the insulating material from being introduced into the electronic components 1 mounted in the component accommodating part 22, it may be formed to have various shapes as long as it has any ring shape enclosing the periphery of the electronic components 1, rather than the shape of the component accommodating part 22.

The blocking part 60 according to the present exemplary embodiment may be the groove formed in the insulating protective layer 19 of the first substrate 10. In addition, as shown in FIG. 8, the blocking part 60 according to the present exemplary embodiment may be formed so that corner portions thereof are spaced apart from the component accommodating part 22 at a distance further than other straight portions.

Figure 8:
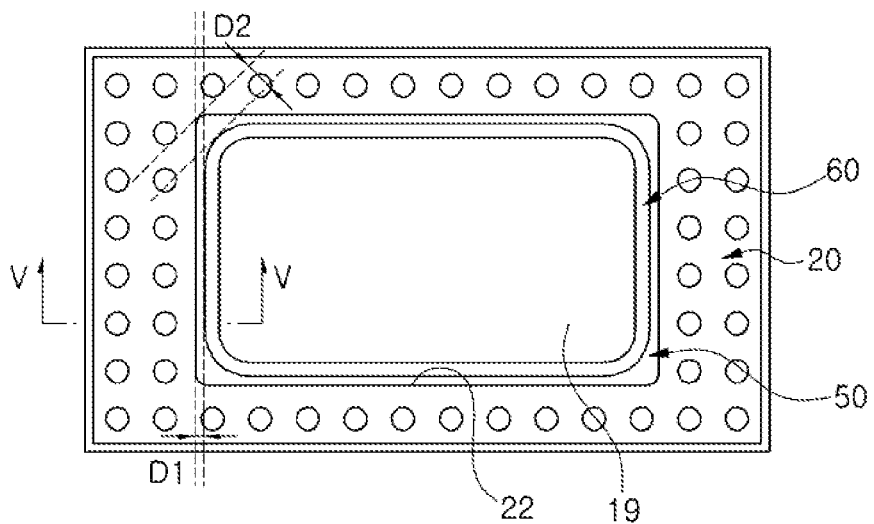
FIG. 8 is a bottom view of FIG. 4.

FIG. 8 is a bottom view of FIG. 4, illustrating the bottom of the first and second substrates 10 and 20 from which the electronic components are omitted.

Referring to FIGS. 4 and 8, the blocking part 60 according to the present exemplary embodiment may be formed to have the corner portions further spaced apart from the component accommodating part 22 of the second substrate 20 by a distance D2. To this end, the corner portions of the blocking part 60 may be curved, that is, rounded. That is, straight edge portions of the blocking part 60 may be spaced apart from the component accommodating part 22 by a predetermined distance D1, and corner portions thereof may be spaced apart from the component accommodating part 22 by a distance D2 greater than the distance D1.

In the case in which D1 and D2 are equal to each other, when the liquid insulating material is injected into the first and second substrates 10 and 20 to form the bonding layer 50, a relatively large amount of insulating material is concentrated in the above-mentioned corner portions, such that the liquid insulating material may overflow into an inner portion of the blocking part 60 through the corner portions.

Therefore, in order to solve the above-mentioned problem, the corner portions of the blocking part 60 according to the present exemplary embodiment may be spaced further apart from the component accommodating part 22, as compared to other portions of the blocking part 60. For example, D2 may be larger than D1 by 5% or more.

Meanwhile, the blocking part 60 is not limited to the above-described configuration of FIG. 8.

FIGS. 9A through 12B are views schematically illustrating a blocking part according to another exemplary embodiment of the present disclosure and show bottom views of the blocking part or cross-sectional views thereof taken along line V-V.

Figure 9A:
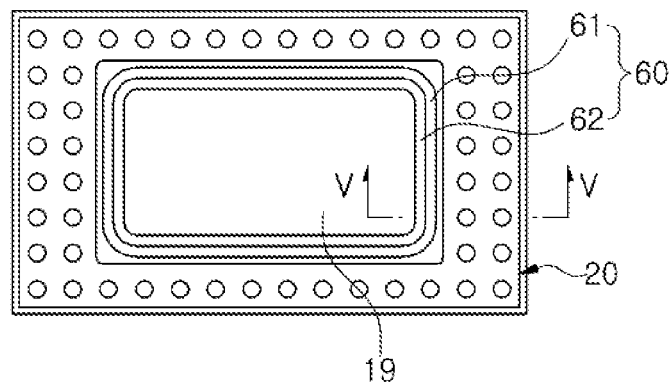
FIGS. 9A through 12B are views schematically illustrating a blocking part according to another exemplary embodiment of the present disclosure.
Figure 9B:
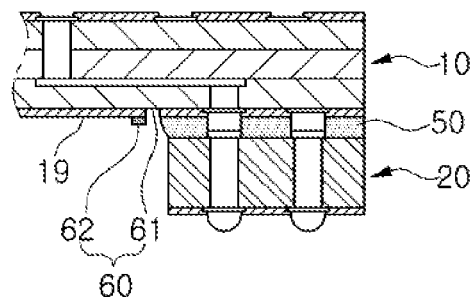

First, referring to FIGS. 9A and 9B, the blocking part 60 according to the present exemplary embodiment may include both a groove region 61 and a dam region 62.

Here, the groove region 61 may be configured to be the same as the blocking part 60 of FIG. 4, and the dam region 62 may be formed to have a protrusion form protruded by a predetermined height along an inner perimeter of the groove region 61.

The dam region 62 may be formed through a silkscreen printing (or a screen printing) method, but is not limited thereto. For example, the dam region 62 may be formed by using various methods such as attaching adhesive tape, mounting an electronic component having a protrusion form or the like. In addition, the dam region 62 may be formed by using a wiring pattern (or a dummy pattern).

As such, in the case in which the dam region 62 is additionally formed in the blocking part 60, a blocking effect may be further secured.

Figure 10A:
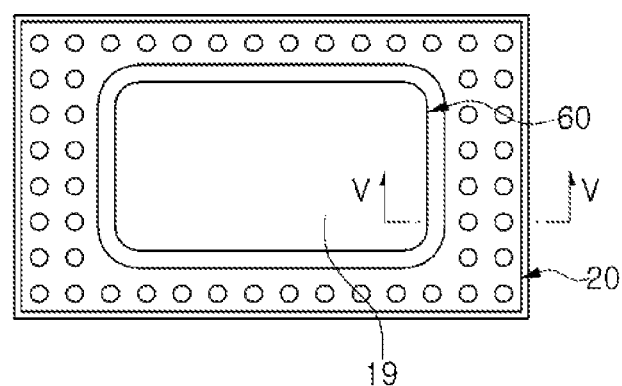
Figure 10B:
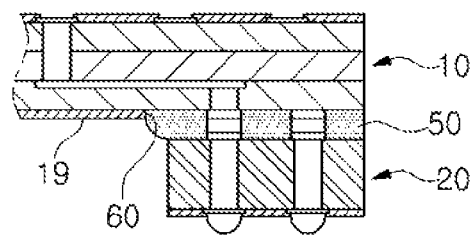

The blocking part 60 shown in FIGS. 10A and 10B may be formed by removing a portion of the insulating protective layer in which the first substrate 10 and the second substrate 20 face each other in the configuration of FIG. 4, with a portion of the insulating protective layer 19 retained in a position corresponding to the inner portion of the blocking part.

In this case, the insulating protective layer 19 may serve as a dam and may block the flow of the liquid insulating material. In addition, as compared to the exemplary embodiments described above, a gap between the first substrate 10 and the second substrate 20 may be further secured.

Figure 11A:
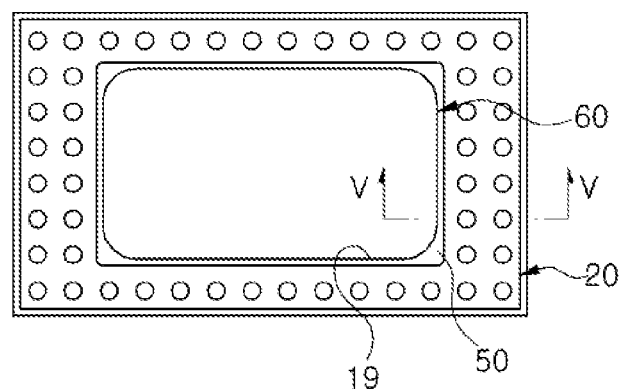
Figure 11B:
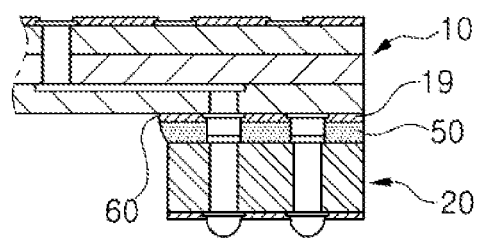

The blocking part 60 shown in FIGS. 11A and 11B, conceptually opposite to the configurations shown in FIGS. 10A and 10B, may be formed by maintaining a portion of the insulating protective layer 19 in which the first substrate 10 and the second substrate 20 face each other and removing a portion of the insulating protective layer 19 corresponding to the inner portion of the blocking part 60.

Figure 12A:
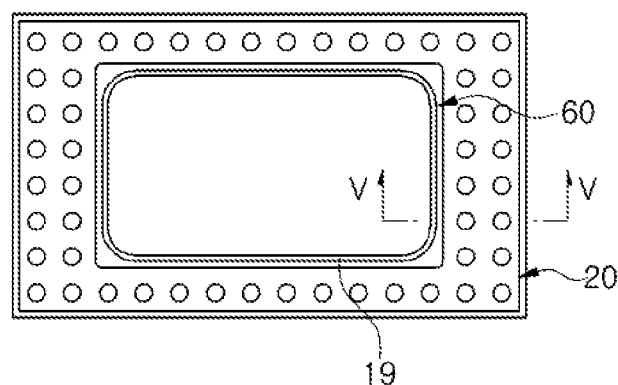
Figure 12B:
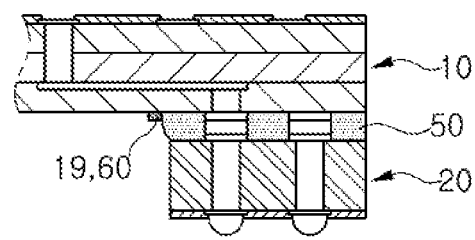

In addition, the blocking part 60 shown in FIGS. 12A and 12B may be formed as a dam protruded from the first substrate 10 by a predetermined height. In this case, the blocking part 60 may be a ring-shape protrusion formed on the first substrate 10. For example, the blocking part 60 according to the present exemplary embodiment may be the protrusion using the insulating protective layer 19 and may be formed by using a solder resist silkscreen printing (or a screen printing) method.

However, the present disclosure is not limited thereto, but the blocking part 60 may be formed using various methods. For example, the blocking part may be formed by attaching adhesive tape or bonding a component having a protrusion form to the insulating protective layer of the first substrate 10. In addition, the blocking part 60 may be formed by using a wiring pattern (or a dummy pattern).

In addition, as described above, the electronic component module 100 according to the present exemplary embodiment may have the bonding layer 50 interposed between the first substrate 10 and the second substrate 20. The bonding layer 50 may be formed of an insulating material and may fill a space between the first substrate 10 and the second substrate 20 to thereby protect conductive members (e.g., bumps, or the like) electrically connecting the first substrate 10 and the second substrate 20 to each other. In addition, the bonding layer 50 may serve to isolate the first substrate 10 from the second substrate 20 and improve adhesion between the first substrate 10 and the second substrate 20 to thereby increase reliability.

An underfill resin may be used for the bonding layer 50. That is, an epoxy resin, or the like may be used as a material of the bonding layer 50, but the material of the bonding layer is not limited thereto.

The bonding layer 50 may be formed by injecting the liquid insulating material, that is, a liquid underfill resin between the first substrate 10 and the second substrate 20 and then curing the same. In this case, the flow of the liquid insulating material to the inner portion of the blocking part 60 may be blocked by the blocking part 60 described above.

In addition, the bonding layer 50 in the present exemplary embodiment is only interposed between the first substrate 10 and the second substrate 20, but is not limited thereto. That is, the bonding layer 50 may also be interposed in the gap between the first substrate 10 and the electronic components 1 mounted on the bottom surface of the first substrate 10. In this case, the bonding layer 50 may be formed to cover the entirety of the bottom surface of the first substrate 10.

As set forth above, according to exemplary embodiments of the present disclosure, the electronic component module may have the electronic components mounted on both surfaces of the first substrate. In addition, the external connection terminal may be provided on the second substrate disposed on the bottom surface of the first substrate.

As a result, the plurality of electronic components maybe mounted on a single substrate (i.e., the first substrate), thereby increasing the degree of integration. In addition, since the external connection terminal for connecting the first substrate on which the electronic components are mounted to an external device is formed on the separate second substrate, the arrangement of the external connection terminal may be facilitated.

In addition, since the two-layer substrate is used as the second substrate, manufacturing costs maybe reduced and the signal transfer path may also be reduced in view of high frequency signal characteristics, thereby reducing unnecessary parasitic components.

In addition, since the corner portions of the blocking part according to the present exemplary embodiment are spaced further apart from the component accommodating part as compared to other portions of the blocking part, this may prevent a relatively large amount of insulating material injected between the first and second substrates from being concentrated in the corner portions to cause the insulating material to overflow into the inner portion of the blocking part.

While exemplary embodiments have been shown and described above, it will be apparent to those skilled in the art that modifications and variations could be made without departing from the spirit and scope of the present disclosure as defined by the appended claims.

What is claimed is:

1. An electronic component module, comprising:
a first substrate having a first surface on which at least one electronic component is mounted;
a second substrate bonded to a second surface of the first substrate, and including at least one component accommodating part in which the at least one electronic component is accommodated, a core layer including a first surface and a second surface, a first metal wiring layer formed on the first surface of the core layer, a second metal wiring layer formed on the second surface of the core layer, and a plurality of electrode pads; and
a bonding layer interposed between the first substrate and the second substrate;
wherein the second surface of the first substrate is provided with a blocking part corresponding to a shape of the component accommodating part of the second substrate to block a movement of the bonding layer.

2. The electronic component module of claim 1, wherein the blocking part is formed as a groove or as a protrusion.

3. The electronic component module of claim 1, wherein the blocking part is spaced apart from the component accommodating part by a predetermined distance in a horizontal direction.

4. The electronic component module of claim 3, wherein the blocking part is spaced apart from corner portions of the component accommodating part by a distance greater than that from straight portions of the component accommodating part.

5. The electronic component module of claim 4, wherein the blocking part is curved or rounded in the corner portions of the component accommodating part.

6. The electronic component module of claim 3, wherein the second surface of the first substrate is provided with an insulating protective layer, and
the blocking part is formed on the insulating protective layer.

7. The electronic component module of claim 6, wherein the insulating protective layer is only formed inside the blocking part.

8. The electronic component module of claim 6, wherein the insulating protective layer is only formed outside the blocking part.

9. An electronic component module, comprising:
a first substrate having a first surface on which an electronic component is mounted; and
a second substrate bonded to a second surface of the first substrate, the second substrate including
a component accommodating part in which the electronic component is accommodated,
a core layer including a first surface and a second surface,
first electrode pads disposed on the first surface of the core layer,
second electrode pads disposed on the second surface of the core layer, and
an insulating protective layer disposed on the second surface of the core layer;
a bonding layer bonded directly to the first substrate and to the first surface of the core layer of the second substrate, and including
conductive members formed in the bonding layer and configured to electrically connect the first substrate to the second substrate.

10. The electronic component module of claim 1, wherein the second substrate is provided with an electrode pad exposed through a through-hole formed in the insulating protective layer.

11. The electronic component module of claim 10, wherein the electrode pad is disposed to be spaced apart from the insulating protective layer in the through-hole formed in the insulating protective layer.

12. The electronic component module of claim 11, wherein the electrode pad fills the through-hole formed in the insulating protective layer.

13. The electronic component module of claim 9, further comprising:
a mold part sealing an electronic component mounted on another surface of the first substrate.

14. An electronic component module, comprising:
a first substrate on which at least one electronic component is mounted;
a second substrate bonded to the first substrate and including at least one component accommodating part, in which the at least one electronic component is accommodated; and
a bonding layer interposed between the first substrate and the second substrate,
wherein the first substrate is provided with a blocking part corresponding to a shape of the component accommodating part of the second substrate to block a movement of the bonding layer, and
a distance between the blocking part and the component accommodating part is greater in corner portions of the blocking part than straight portions of the blocking part.

* * * * *